United States Patent
Oda

(10) Patent No.: US 7,893,364 B2
(45) Date of Patent: Feb. 22, 2011

(54) ELECTRICAL JUNCTION BOX

(75) Inventor: Akihiro Oda, Yokkaichi (JP)

(73) Assignee: Sumitomo Wiring Systems, Ltd., Mie (JP)

( * ) Notice: Subject to any disclaimer, the term of this patent is extended or adjusted under 35 U.S.C. 154(b) by 594 days.

(21) Appl. No.: 12/000,169

(22) Filed: Dec. 10, 2007

(65) Prior Publication Data

US 2008/0149387 A1 Jun. 26, 2008

(30) Foreign Application Priority Data

Dec. 20, 2006 (JP) ............................. 2006-342147

(51) Int. Cl.
*H05K 5/00* (2006.01)

(52) U.S. Cl. .................. 174/520; 174/50; 439/76.1; 439/76.2; 439/949

(58) Field of Classification Search .................. 174/50, 174/520, 60, 69, 66, 67; 439/76.1, 76.2, 439/949, 535; 220/3.2, 4.02, 241, 242; 361/600, 361/601
See application file for complete search history.

(56) References Cited

U.S. PATENT DOCUMENTS

| 4,460,232 | A | * | 7/1984 | Sotolongo | 439/535 |
| 6,178,106 | B1 | | 1/2001 | Umemoto et al. | |
| 6,276,960 | B1 | | 8/2001 | Schaefer et al. | |
| 6,322,376 | B1 | * | 11/2001 | Jetton | 439/76.2 |
| 6,679,708 | B1 | * | 1/2004 | Depp et al. | 439/76.2 |
| 7,670,184 | B2 | * | 3/2010 | Akahori et al. | 439/76.2 |
| 7,699,623 | B2 | * | 4/2010 | Yoshida et al. | 439/76.2 |

FOREIGN PATENT DOCUMENTS

| JP | A 2005-185002 | 7/2005 |
| JP | A 2006-191784 | 7/2006 |

* cited by examiner

*Primary Examiner*—Angel R Estrada
(74) *Attorney, Agent, or Firm*—Oliff & Berridge, plc

(57) ABSTRACT

An electrical junction box includes a casing body containing a bus bar that serves as an internal circuit. A bus bar terminal portion is disposed on an outer edge of an upper surface of the casing body to be connected to a terminal. An electrical wire, on which the terminal is caulked, is arranged horizontally along an outer side wall of the casing body. A terminal cover encloses an electrical wire pressing section of the terminal. The terminal cover is fitted in a depression provided in the outer side wall of the casing body.

8 Claims, 8 Drawing Sheets

US 7,893,364 B2

ELECTRICAL JUNCTION BOX

This application claims priority from Japanese Patent Application No. 2006-342147 filed in the Japanese Patent Office on Dec. 20, 2006, the disclosure of which is incorporated herein by reference in its entirety.

BACKGROUND

Exemplary embodiments of the invention relate to an electrical junction box and more particularly an electrical junction box to be mounted on a motor vehicle. A bus bar is contained in a casing body of the electrical junction box and an electrical wire connected to the bus bar is arranged along an outer side wall of the electrical junction box to prevent interference between the electrical wire and other parts disposed around the electrical junction box.

Generally, in an electrical junction box to be mounted on a motor vehicle, a bus bar that serves as an internal circuit is contained in a casing body. The bus bar is connected to a relay, a fuse, and the like and is accommodated in a fuse containing section and a relay containing section of the casing body and is also connected to an electrical power source wire inserted into the casing body.

For example, in JP2005-185002A, as shown in FIGS. 7A and 7B, a terminal 3 is connected to a distal end of an electrical wire w. An electrical contact section 3a of the terminal 3 is superimposed on an upper surface of a terminal portion 2a of a bus bar 2 disposed in a casing body 1, and the section 3a and portion 2a are fastened and fixed on each other by a bolt B and a nut (not shown), thereby connecting the electrical wire w to the bus bar 2 and drawing the electrical wire w under the casing body 1.

However, when peripheral parts are arranged near a bottom wall of the electrical junction box, when the electrical wire w is drawn downward, the electrical wire w can be damaged due to interference between the electrical wire and the peripheral parts.

The terminal 3 is connected to the distal end of the electrical wire w drawn down under the electrical junction box and formed into an L-shaped configuration. Since the electrical contact section 3b is disposed outside the casing body 1, it is necessary to provide a hood-like cover wall 4a on an upper cover 4 shown in FIG. 8 to contain the electrical contact section 3b. When such cover wall is provided on the upper cover, the upper cover becomes complicated in structure and the cost of dies for forming the upper cover is increased.

On the other hand, JP2006-191784A discloses an electrical junction box in which a wire harness introduction section 5 is integrated with a casing body 1 and projects upward from the casing body 1, as shown in FIG. 9. Such a kind of an electrical junction box requires not only additional space, but also an increase in manual labor as the direction of drawing the wire harness must be manually regulated. Consequently, workability is lowered.

SUMMARY

In view of the above problems, exemplary embodiments of the present invention provide an electrical junction box that includes a casing body containing a bus bar. These exemplary embodiments can prevent an electrical wire connected to the bus bar from interfering with peripheral parts, can positively protect portions at which the electrical wire and a terminal are pressed, without providing a cover wall on an upper cover, can be downsized and can enhance workability in assembling the electrical wire.

In order to overcome the above problems, exemplary embodiments of an electrical junction box include a casing body containing a bus bar that serves as an internal circuit, wherein a bus bar terminal portion is disposed on an outer edge of an upper surface of the casing body to be connected to a bolt-fastened terminal; an electrical wire, on which the bolt-fastened terminal is caulked, is arranged horizontally along an outer side wall of the casing body; a terminal cover encloses an electrical wire pressing section of the bolt-fastened terminal; and the terminal cover is fitted in a depression provided in the outer side wall of the casing body.

According to the above exemplary structure, it is possible to protect and waterproof the electrical wire pressing section of the bolt-fastened terminal by the terminal cover enclosing the electrical wire pressing section without the need for a cover wall or the like provided on the upper cover. Since the terminal cover is fitted in the depression provided in the outer side wall of the casing body, the terminal cover serves as a part of the outer side wall of the casing body. Accordingly, it is possible to downsize the casing body and save space.

Furthermore, it is possible to electrically connect the terminals to each other and simultaneously to fix the terminal cover on the casing body by superimposing the electrical contact section of the bolt-fastened terminal on the bus bar terminal portion and by fastening them by the bolt. Therefore, it is possible to enhance workability and to prevent interference between the electrical wire and the peripheral parts, since the electrical wire can be drawn horizontally along the outer side wall of the casing body, even if a worker does not hold the drawing direction of the electrical wire in the horizontal direction. According to the above exemplary structure, it also is possible to shorten the electrical wire, since the electrical wire is not loosened.

The bolt-fastened terminal includes an electrical contact section extending from the electrical wire pressing section in a direction perpendicular to a terminal axis. The electrical contact section is superimposed on the bus bar terminal portion. A bolt or other fastener is inserted into and fastened in bolt holes provided in the electrical contact section and the bus bar terminal portion.

As described above, the electrical contact section provided with the bolt hole projects from the distal end of the electrical wire pressing section of the bolt-fastened terminal in a direction perpendicular to the terminal axis so that the surface of the electrical wire pressing section intersects the surface of the electrical contact section substantially perpendicularly. Consequently, the drawing direction of the electrical wire is set to be the horizontal direction along the outer side wall of the casing body and the electrical wire pressing section is disposed along the outer side wall of the casing body on the upper surface of which the bus bar terminal portion is disposed. The electrical contact section can be steadily superimposed on the bus bar terminal portion and they can be secured by the bolt.

The casing body is provided in an outer side wall with a rectangular depression extending from an upper end to a lower end of the outer side wall. The terminal cover includes first and second rectangular divided members coupled through hinge portions to each other to be opened and closed with respect to each other. The first divided member includes a bulged portion for fitting the electrical wire while the second divided member has a flat inner surface. When the electrical wire pressing section of the bolt-fastened terminal is contained in the first divided member provided with the bulged portion for fitting the electrical wire and the second divided member closes the first divided member, the electrical contact section of the terminal projects from the terminal cover.

While the exemplary embodiments use a rectangular depression, the depression may have a variety of shapes, such as square, circular, elliptical, polygonal or the like.

As described above, the terminal cover comprises the first and second rectangular divided members, which can be opened and closed through the hinge portions. The first divided member contains the electrical wire pressing section while the second divided member can close the first divided member. In the closing position of the second divided member, the electrical contact section of the terminal projects from the first and second divided members. It is possible for a worker to contain the whole of the electrical wire pressing section of the bolt-fastened terminal in the terminal cover and to close the terminal cover by a very easy operation. Only the electrical contact section can project from the clearance between the first and second divided members that are closed and coupled to each other. Since the terminal cover comprises the first and second divided members and the hinge portions, the number of parts can be reduced.

Furthermore, as described above, since the bulged portion for fitting the electrical wire is provided on the first divided member of the terminal cover, the bulged portion can cover further outward the electrical wire including the electrical wire pressing section in accordance with a diameter size of the electrical wire. Consequently, the electrical wire itself can be positively fixed to and disposed closely on the casing body. Accordingly, since it is possible to more reliably hold the electrical wire horizontally and to prevent the electrical wire from being loosened, it is possible to effectively prevent interference between the electrical wire and other parts and to shorten the electrical wire.

As described above, since the rectangular depression is provided in the outer side wall of the casing body from the upper end to the lower end of the outer side wall and the rectangular closed terminal cover is fitted in the depression, the rectangular configurations can facilitate a working for fitting the terminal cover in the depression. It is possible to lower a cost of dies for the casing body including the terminal cover and depression.

A guide groove is provided on at least one of opposite side portions interposing the depression in the casing body. A guide projection is provided on the terminal cover. When the guide projection is inserted into the guide groove to fit the terminal cover in the depression, the cover serves as a watertight wall continued to the outer side wall of the casing body.

As described above, since the guide groove is provided in at least one of the opposite side portions interposing the depression of the casing body and the guide projection is provided on the projection wall to oppose the guide groove of the terminal cover, it is possible to easily fit the terminal cover in the depression of the casing body merely by sliding the guide projection in the guide groove to the lower end, thereby positioning the terminal cover in the casing body. It is possible to reliably secure the terminal cover in the casing body by fastening a single bolt on the bolt-fastened terminal. Accordingly, it is not necessary to provide locking structures on the casing body and terminal cover. In the case where maintenance is required, it is possible to easily remove the terminal cover from the casing body by loosening the bolt and sliding the terminal cover off of the casing body, thereby enhancing workability.

Preferably, the guide grooves are provided on the opposite side portions interposing the depression of the casing body and the guide projections are provided on the opposite sides of the terminal cover.

In the fitting condition mentioned above, since the terminal cover defines the watertight wall continued to the outer side wall of the casing body, it is possible to effectively restrict water from entering the casing body.

Preferably, a positioning rib is provided on an outer surface of the second divided member having no bulged portion for fitting the electrical wire. A positioning recess is provided in an outer surface of the casing body inside the depression. The guide projection is inserted into the guide groove and the positioning rib is fitted in the positioning recess.

In the case where the terminal cover is fitted in the depression provided in the outer side wall of the casing body, the first divided member provided with the bulged portion for fitting the electrical wire is disposed at the outer side wall of the casing body while the second divided member provided with no bulged portion is disposed at the inner side of the casing body. Accordingly, as described above, the positioning rib is provided on the outer surface of the second divided member having no bulged portion for fitting the electrical wire, the positioning recess is provided in the outer side wall of the casing body inside the depression, the guide projection is inserted into the guide groove, and the positioning rib is fitted in the positioning recess. This construction can positively carry out positioning of the terminal cover on the casing body.

An upper cover and a lower cover are attached to the casing body. Preferably, the terminal cover is attached to the casing body between the upper cover and the lower cover.

As described above, since the terminal cover is disposed between the upper cover and the lower cover, it is possible to completely insulate and protect the bolt-fastened terminal connected to the bus bar and the interior in casing body from the outside.

As described above, according to the present invention, it is possible to protect and waterproof the electrical wire pressing section of the bolt-fastened terminal by the terminal cover enclosing the electrical wire pressing section, although a cover wall is not provided on the upper cover and the like. Since the terminal cover is fitted in the depression provided in the outer side wall of the casing body, the terminal cover serves as a part of the outer side wall of the casing body. Accordingly, it is possible to reduce the size of the casing body and save space.

Furthermore, it is possible to electrically connect the terminals to each other and simultaneously to fix the terminal cover on the casing body merely by superimposing the electrical contact section of the bolt-fastened terminal on the bus bar terminal portion and by fastening them by the bolt. It is possible to enhance workability and to prevent interference between the electrical wire and the peripheral parts, since the electrical wire can be drawn horizontally along the outer side wall of the casing body, even if a worker does not hold the drawing direction of the electrical wire in the horizontal direction by hand. According to the above structure, it is also possible to shorten the electrical wire, since the electrical wire is not loosened.

As described above, the electrical contact section provided with the bolt hole projects from the distal end of the electrical wire pressing section of the bolt-fastened terminal in a direction perpendicular to the terminal axis so that the surface of the electrical wire pressing section intersects the surface of the electrical contact section perpendicularly. Consequently, the drawing direction of the electrical wire is set to be the horizontal direction along the outer side wall of the casing body and the electrical wire pressing section is disposed along the outer side wall of the casing body on the upper surface of which the bus bar terminal portion is disposed. The electrical contact section can be steadily superimposed on the bus bar terminal portion and they can be secured by the bolt.

Furthermore, as described above, the terminal cover comprises the first and second rectangular divided members, which can be opened and closed through the hinge portions. The first divided member contains the electrical wire pressing section while the second divided member can close the first divided member. In the closing position of the second divided member, the electrical contact section of the terminal projects from the first and second divided members. It is possible for a worker to contain the whole of the electrical wire pressing section of the bolt-fastened terminal in the terminal cover and to close the terminal cover by a very easy operation. Only the electrical contact section can project from the clearance between the first and second divided members that are closed and coupled to each other.

In addition, as described above, since the bulged portion for fitting the electrical wire is provided on the first divided member of the terminal cover, the bulged portion can cover further outward the electrical wire including the electrical wire pressing section in accordance with a diameter size of the electrical wire. Consequently, the electrical wire itself can be positively fixed to and disposed closely on the casing body. Accordingly, since it is possible to more reliably hold the electrical wire horizontally and to prevent the electrical wire from being loosened, it is possible to effectively prevent interference between the electrical wire and other parts and to shorten the electrical wire.

Furthermore, as described above, since the guide groove is provided in at least one of the opposite side portions interposing the depression of the casing body and the guide projection is provided on the projection wall to oppose the guide groove of the terminal cover, it is possible to easily fit the terminal cover in the depression of the casing body merely by sliding the guide projection in the guide groove to the lower end, thereby positioning the terminal cover in the casing body. Thus, it is possible to reliably secure the terminal cover in the casing body by fastening a single bolt on the bolt-fastened terminal.

In the fitting condition mentioned above, since the terminal cover defines the watertight wall continued to the outer side wall of the casing body, it is possible to effectively restrict water from entering the casing body.

In addition, as described above, the positioning rib is provided on the outer surface of the second divided member having no bulged portion for fitting the electrical wire. The positioning recess is provided in the outer surface of the casing body inside the depression. The guide projection is inserted into the guide groove. The positioning rib is fitted in the positioning recess. Consequently, it is possible to more reliably position the terminal cover on the casing body.

BRIEF DESCRIPTION OF THE DRAWINGS

Below, a detailed description will be given with reference to the drawings, in which like numerals indicate like parts, and in which.

DETAILED DESCRIPTION OF EXEMPLARY EMBODIMENTS

Figure 1:
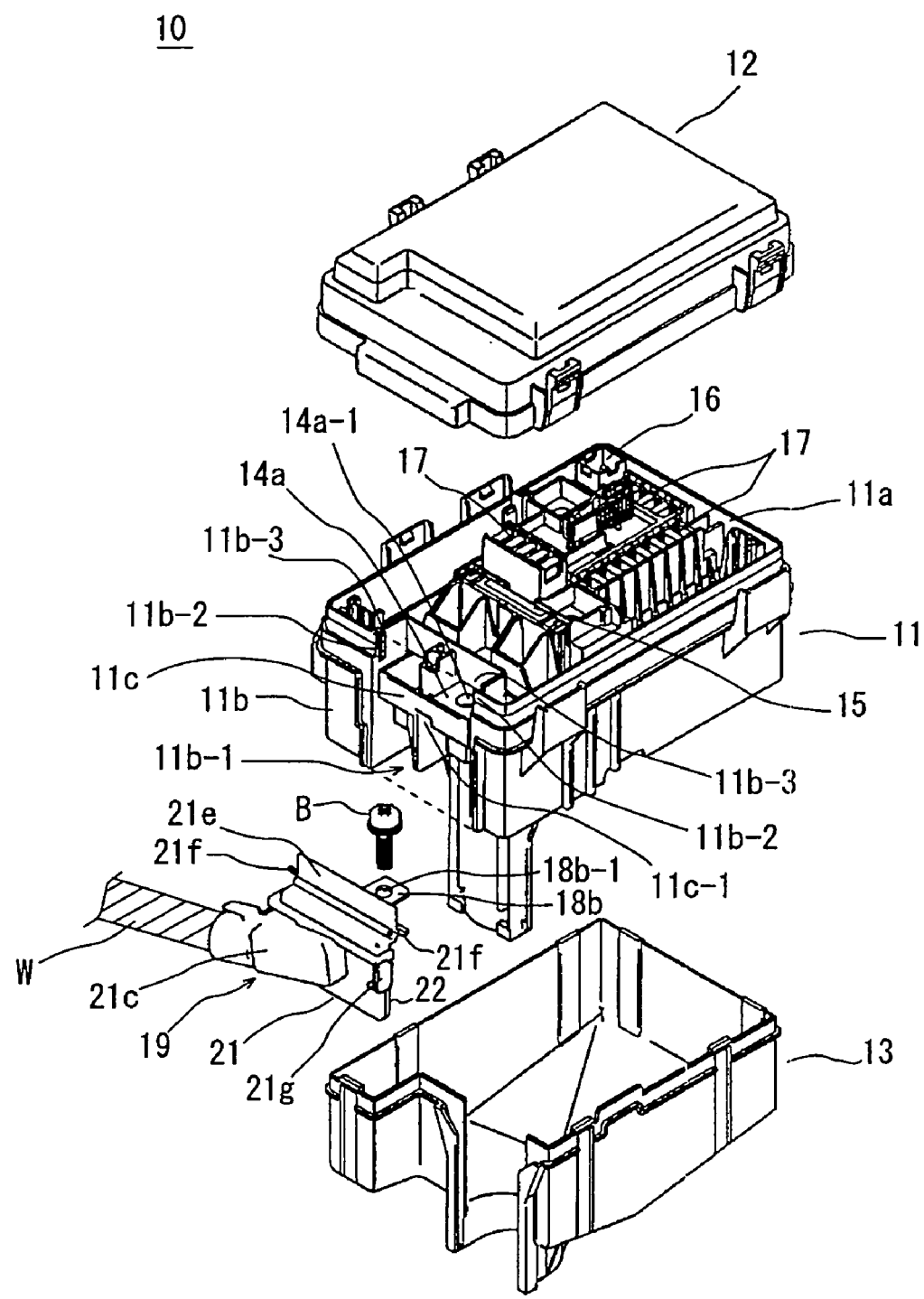
FIG. 1 is an exploded perspective view of an embodiment of an electrical junction box.

Referring now to the drawings, an exemplary embodiment of an electrical junction box is described below.

FIGS. 1 to 6 show an embodiment of an electrical junction box 10. The electrical junction box 10 includes a casing body 11, an upper cover 12 mounted on an upper surface of the casing body 11, and a lower cover 13 mounted on a lower surface of the casing body 11.

Figure 2A:
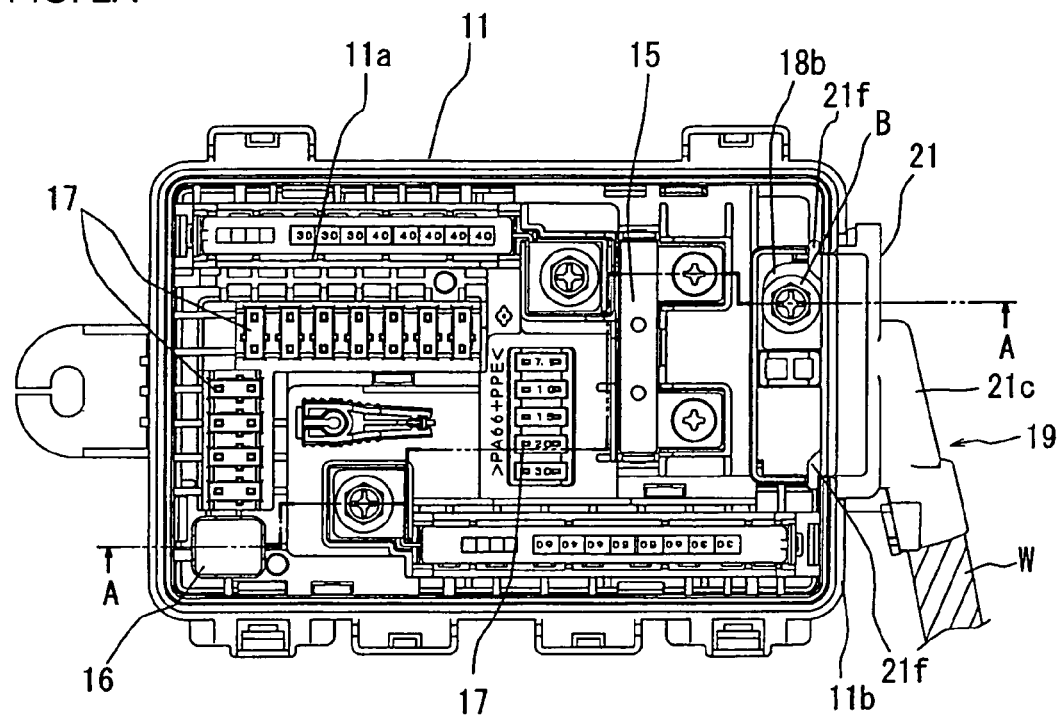
FIG. 2A is a plan view of an exemplary casing body.
Figure 2B:
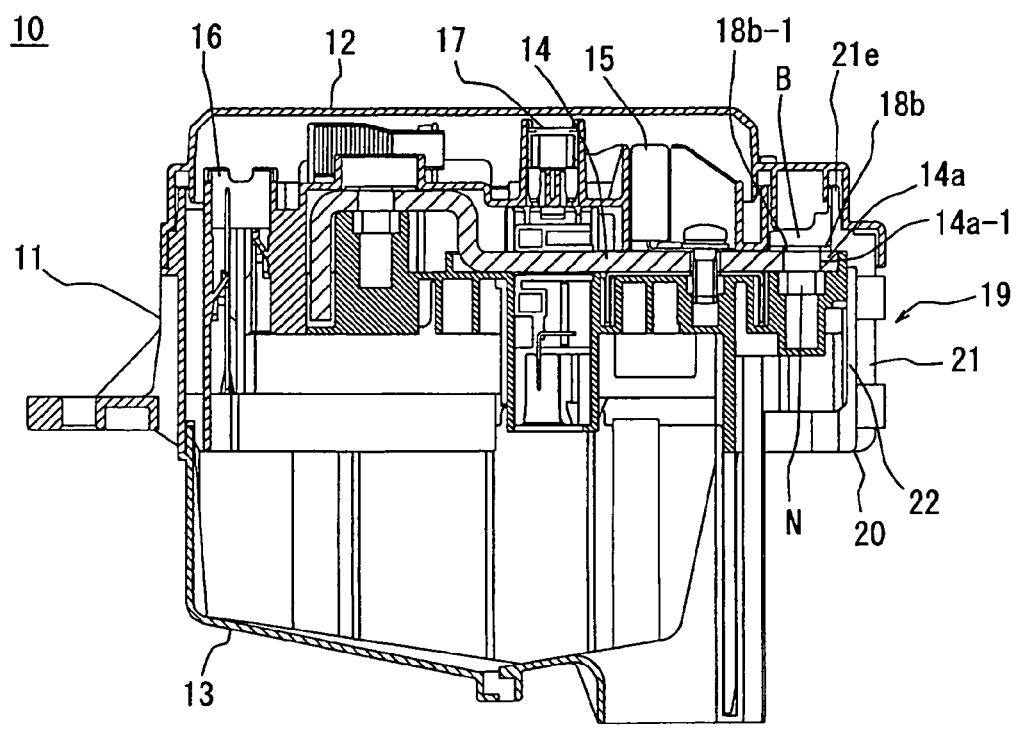
FIG. 2B is a sectional view of the casing body taken along lines A-A in FIG. 2A.

As shown in FIGS. 1 to 2B, the casing body 11 contains a bus bar 14 that serves as an internal circuit. The casing body 11 is provided on an upper surface 11*a* with a fusible link mounting section 15, a relay containing section 16, and a fuse containing section 17. The casing body 11 is provided along an outer edge of the upper surface 11*a* with a terminal portion 14*a* of the bus bar 14 connected to a bolt-fastened terminal 18 on an end of an electrical wire w.

Figure 3:
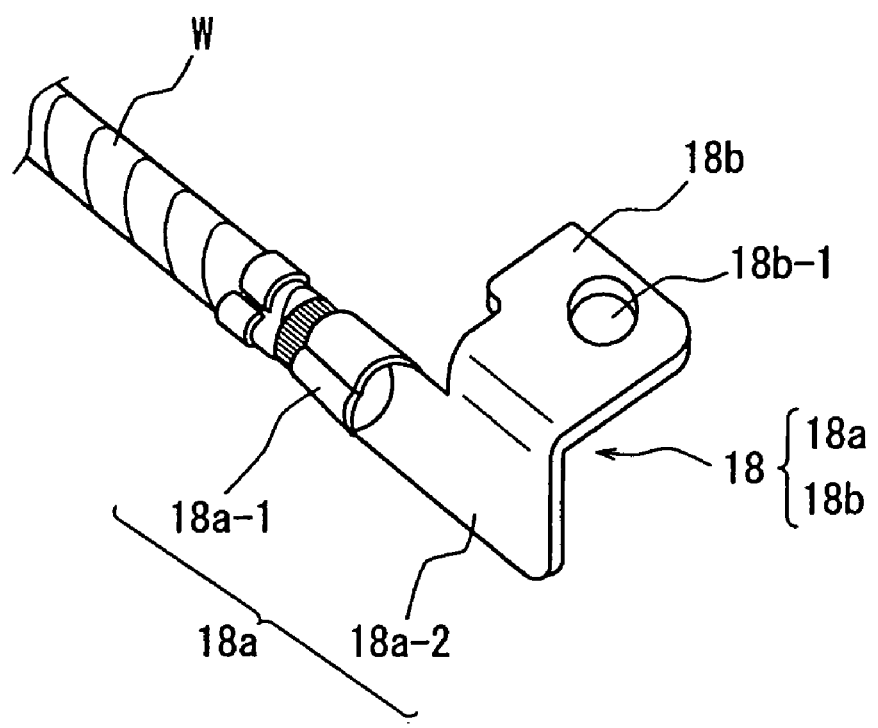
FIG. 3 is a schematically perspective view of an exemplary bolt-fastened terminal in an embodiment.
Figure 4A:
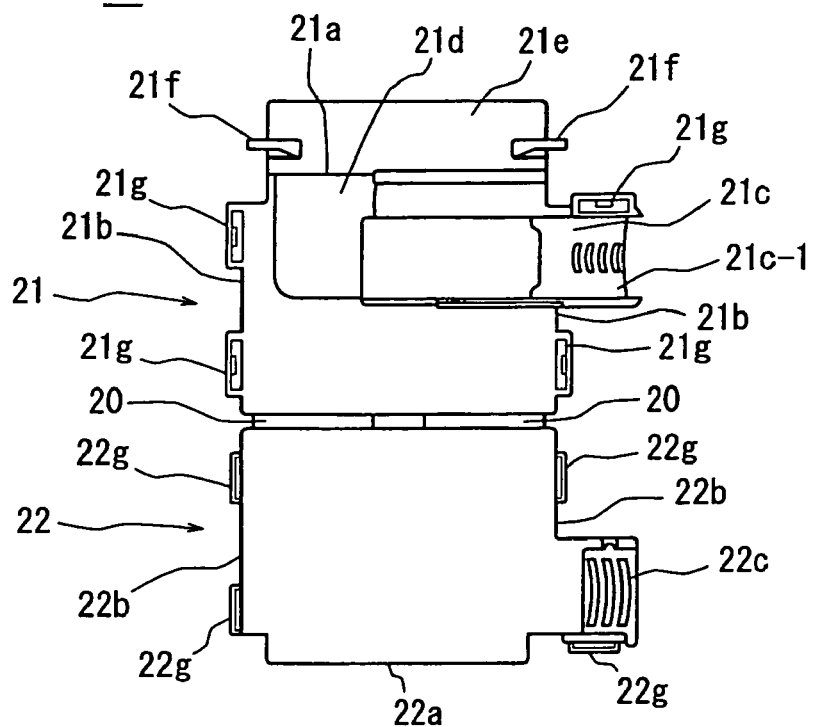
FIG. 4A is a plan view of an exemplary terminal cover in an embodiment, illustrating the inside of the terminal cover.
Figure 4B:
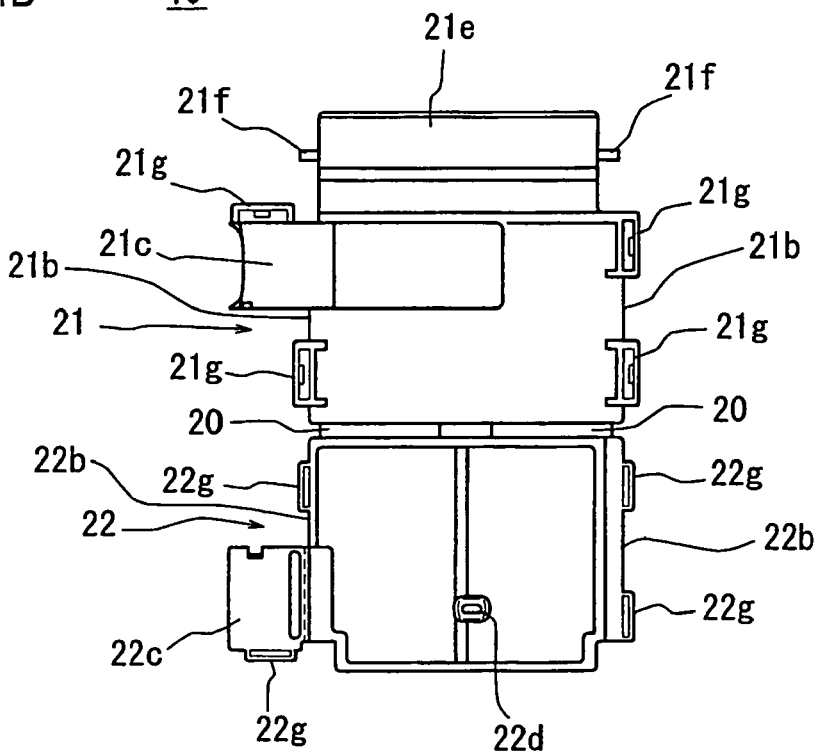
FIG. 4B is a plan view of the exemplary terminal cover, illustrating the outside of the exemplary terminal cover.

As shown in FIG. 3, the bolt-fastened terminal 18 comprises an electrical wire pressing section 18*a* and an electrical contact section 18*b*. The electrical wire pressing section 18*a* connected to the distal end of the electrical wire w includes a caulking portion 18*a*-1 and a flat plate portion 18*a*-2. The electrical contact section 18*b* is provided with a bolt hole 18*b*-1 and projects substantially perpendicularly from an upper side edge of the flat plate portion 18*a*-2 in FIG. 3. The electrical contact section 18*b* is bent at an angle of substantially 90 degrees in a direction opposite from the caulking portion 18*a*-1 so that the flat plate portion 18*a*-2 of the electrical wire pressing section 18*a* intersects the electrical contact section 18*b* substantially perpendicularly. While in this embodiment the electrical contact section projects substantially perpendicularly from an upper side edge of the flat plate portion 18*a*-2, the electrical contact section may project from the upper side edge of the flat plate portion at a variety of angles.

As shown in FIGS. 4A-5B, a terminal cover 19 for containing the electrical wire pressing section 18*a* is attached to the bolt-fastened terminal 18 connected to the end of the electrical wire w.

Figure 5A:
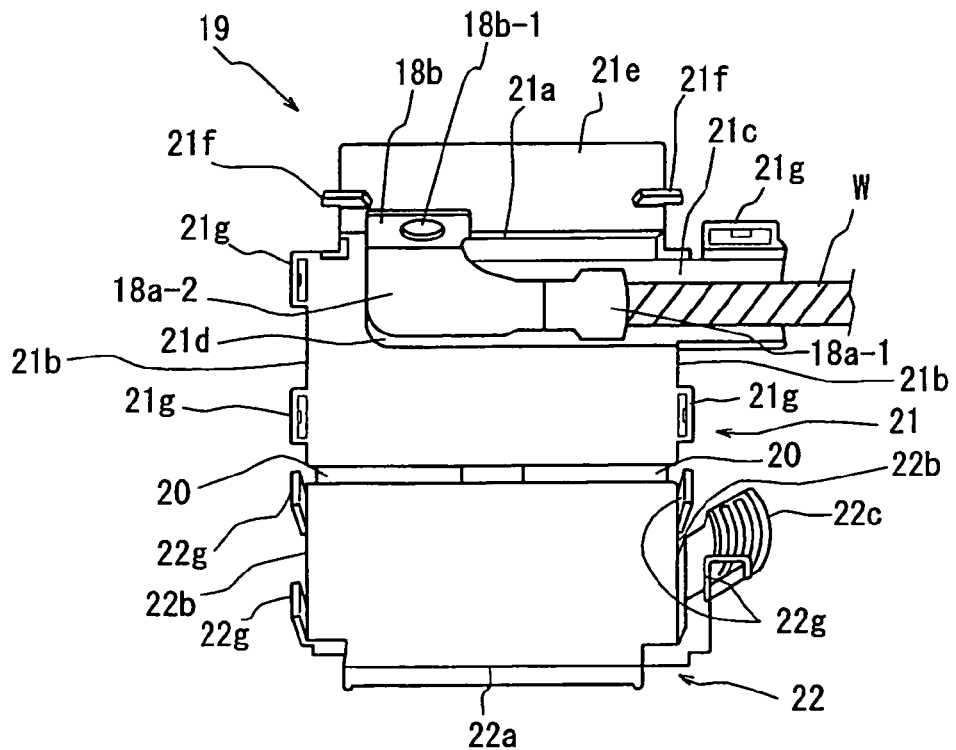
FIG. 5A is a plan view of the exemplary terminal cover in an embodiment, illustrating an exemplary electrical wire pressing section of the bolt-fastened terminal positioned on a first divided member in order to contain the electrical wire pressing section in the exemplary terminal cover.
Figure 5B:
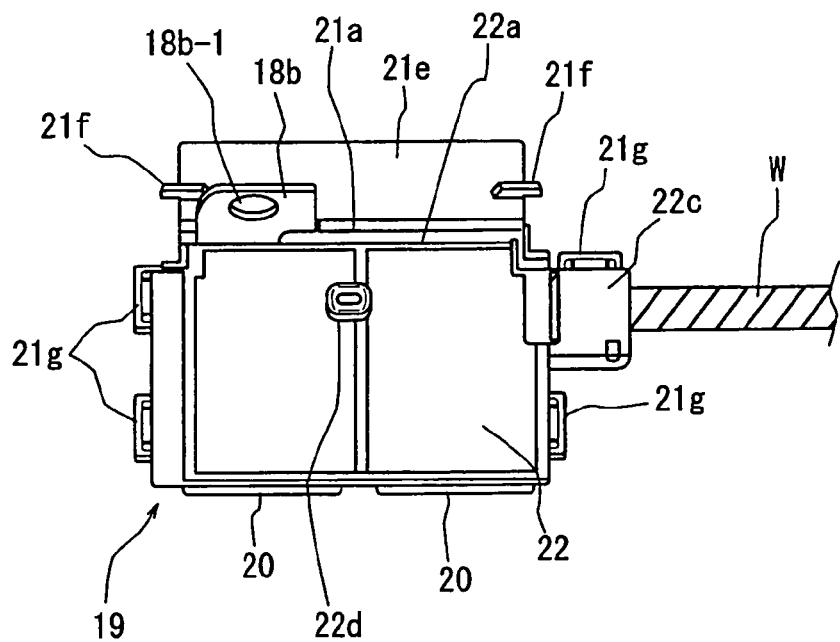
FIG. 5B is a plan view of the exemplary terminal cover, illustrating the exemplary terminal cover in a closed position.
Figure 6:
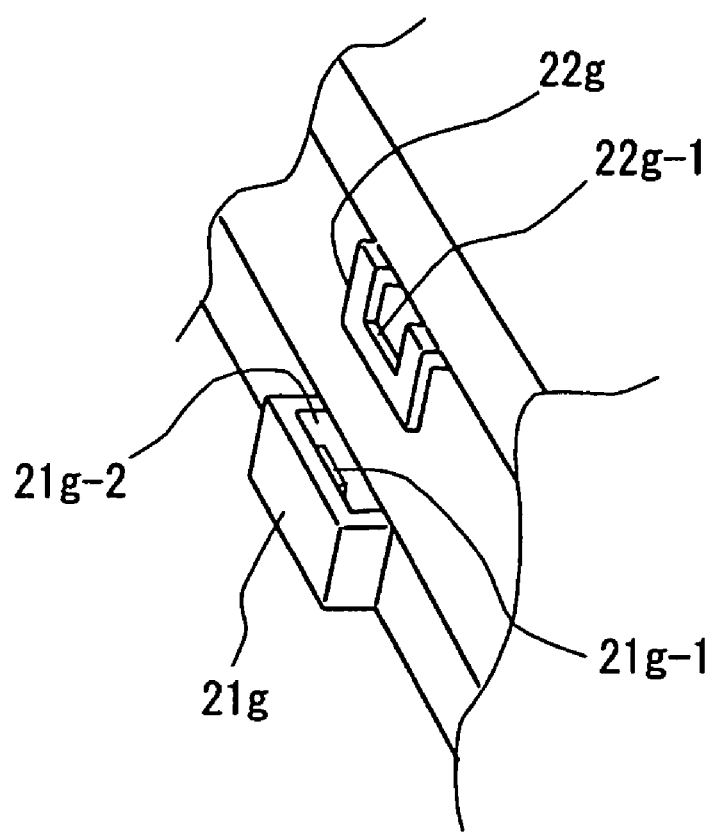
FIG. 6 is a schematically perspective view of a exemplary locking frame portion and a frame portion being locked.
Figure 7A:
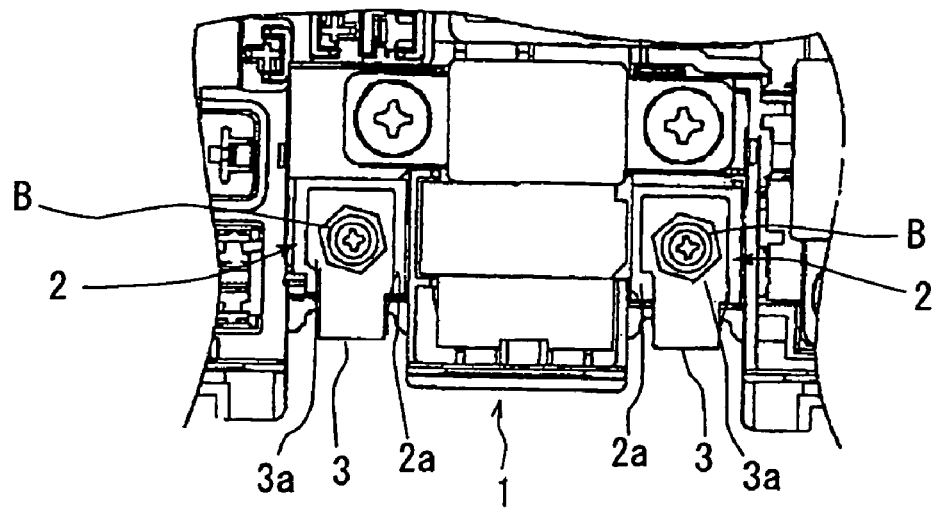
FIG. 7A is a plan view of a prior art electrical junction box.
Figure 7B:
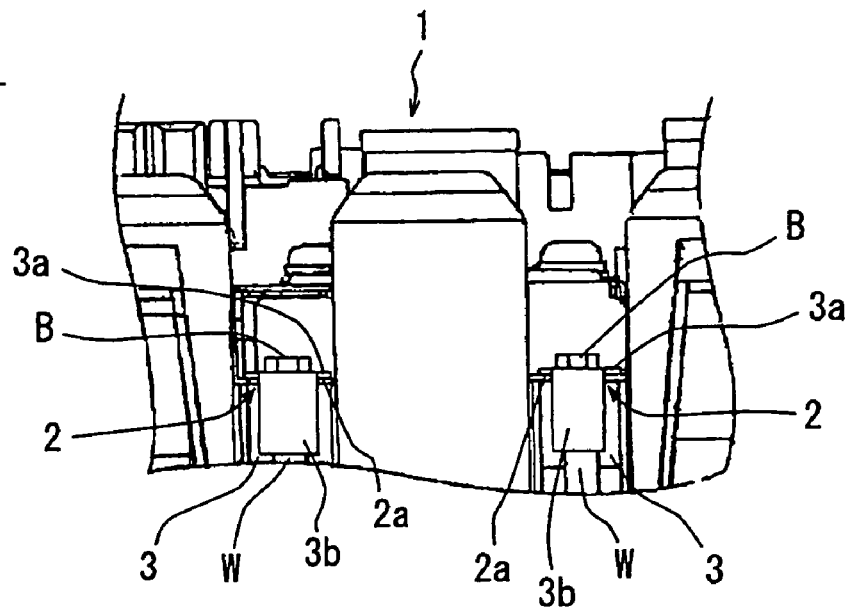
FIG. 7B is a side elevation view of the prior art electrical junction box shown in FIG. 7A.
Figure 8:
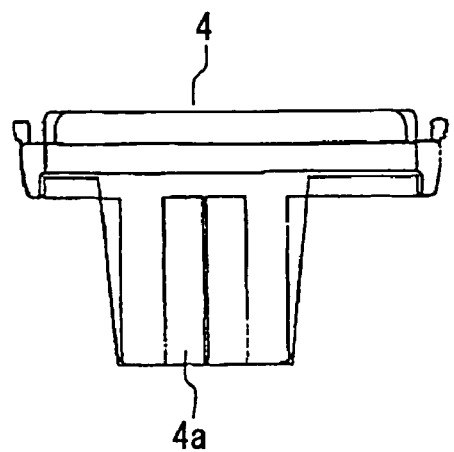
FIG. 8 is a plan view of an upper cover of a prior art electrical junction box.
Figure 9:
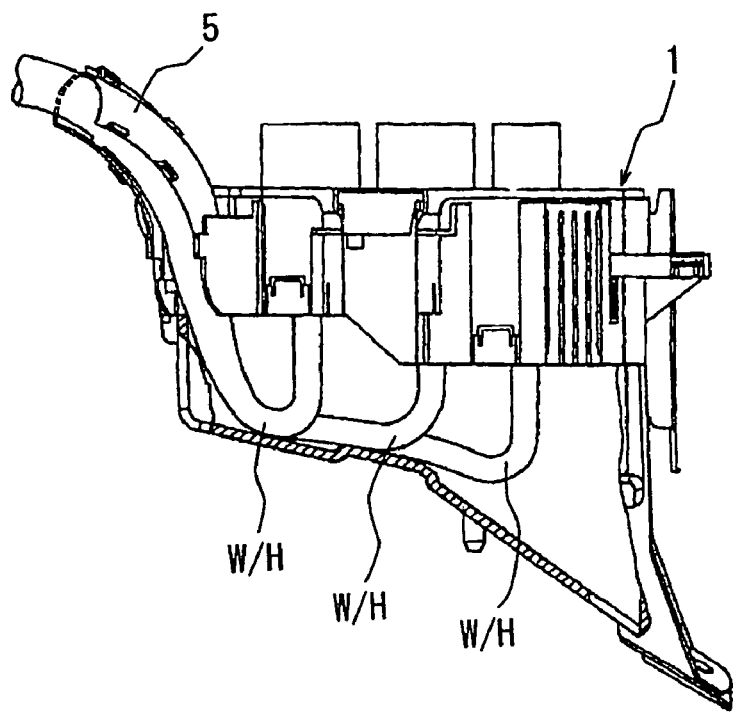
FIG. 9 is a side elevation view of a prior art electrical junction box.

The terminal cover 19 includes first and second rectangular divided members 21 and 22 coupled to each other through hinge portions 20 so that they can be set in opened and closed positions. As shown in FIGS. 5A and 5B, when the first and second divided members 21 and 22 of the terminal cover 19 are brought into closed positions, the first and second divided members 21 and 22 clamp the electrical wire pressing section 18*a* of the bolt-fastened terminal 18 connected to the electrical wire end so that an axial direction of the electrical wire pressing section 18*a* is disposed along a lateral direction of the divided members 21 and 22 (i.e., a longitudinal direction of the hinge portions 20). Consequently, the electrical contact section 18b provided with the bolt hole 18b-1 can project from a clearance between upper side edges 21a and 22a of the first and second divided members 21 and 22 coupled to each other.

More particularly, the first divided member 21 is provided on a side wall with an outward bulged portion 21c for fitting the electrical wire w. An end portion of the electrical wire w is caulked on the caulking portion 18a-1 of the electrical wire pressing section 18a. The end portion is fitted in the bulged portion 21c so that the caulked side of the end portion is directed outside.

In order to position the electrical wire pressing section 18a in the terminal cover 19, the first divided member 21 is provided on an inner surface with a containing section 21d that has a substantially same configuration as that of the flat plate portion 18a-2 of the electrical wire pressing section 18a and continues to the bulged portion 21c for fitting the electrical wire w.

Furthermore, a projection wall 21e stands up from the upper side edge 21a of the first divided member 21. Guide projections 21f extend from opposite sides of the projection wall 21e.

On the other hand, the second divided member 22 is opened and closed through the hinge portions 20 with respect to the first divided member 21. The second divided member 22 is provided at the position opposing to the end 21c-1 of the bulged portion 21c with a closing portion 22c for closing the bulged portion 21c.

The second divided member 22 is also provided on an outer surface with a positioning rib 22d. The positioning rib 22d engages a positioning recess 11c-1 of an outer side surface 11c on the casing body 11 when the terminal cover 19 is fitted on the depression 11b-1 provided on an outer side wall 11b of the casing body 11. The outer side surface 11c is disposed inside the depression 11b-1 (see FIG. 1).

In addition, the first divided member 21 is provided on a side portion 21b and the bulged portion 21c with four locking frame portions 21g (see FIG. 6) each having a U-shaped configuration in plan view and projecting toward the bulged portion. On the other hand, the second divided member 22 is provided on a side wall 22b and the closing portion 22c with four frame portions being locked 22g each having a U-shaped configuration in a side elevation view. Each frame portion being locked 22g is inserted into an opening 21g-2 in the locking frame 21g so that locking pawls 21g-1 are engaged with inner frame portions 22g-1.

On the other hand, as shown in FIG. 1, the casing body 11 is provided on the outer side wall 11b with the rectangular depression 11b-1 that extends from an upper end of the body 11 to a lower end of the body to receive the terminal cover 19. The casing body 11 is provided on opposite side portions 11b-2 of the outer side wall 11b with guide grooves 11b-3 that receive the guide projections 21f of the terminal cover 19 to guide the guide projections 21f while sliding the guide projections 21f. As described above, the outer side wall 11c of casing body 11 is provided with positioning recess 11c-1 inside the depression 11b-1.

Next, an exemplary process for assembling the exemplary electrical junction box is described below.

First, as shown in FIGS. 5A and 5B, the electrical wire pressing section 18a of the bolt-fastened terminal 18 on the electrical wire end is contained in the terminal cover 19. That is, the distal end of the electrical wire w caulked by the caulking portion 18a-1 of the electrical wire pressing section 18a is engaged with the bulged portion 21c of the first divided member 21 so that the caulked side of the electrical wire end is directed outside. The flat plate portion 18a-2 of the electrical wire pressing section 18a is engaged with the containing section 21d in the first divided member 21. After the electrical wire pressing section 18a is positioned on the inner surface of the first divided member 21, as shown in FIG. 5A, the second divided member 22 coupled through the hinge portions 20 to the first divided member 21 closes the upper surface of the first divided member 21, as shown in FIG. 5B.

At this time, the locking pawl 21g-1 of each locking frame 21g of the first divided member 21 engages the inner frame portion 22g-1 of each frame portion being locked 22g of the second divided member 22. Then, the electrical wire pressing section 18a is clamped between the first and second divided members 21 and 22. The electrical contact section 18b provided with the bolt hole 18b-1 projects substantially vertically from the clearance between the upper side edges 21a and 22a of the first and second divided members 21 and 22 coupled to each other.

Next, the guide projections 21f on the opposite sides of the projection wall 21e are inserted into the guide grooves 11b-3 provided on the opposite side portions 11b-2 on the outer side wall 11b of the casing body 11 so that the first divided member 21 is directed outside. The positioning rib 22d provided on the outer surface of the second divided member 22 disposed on the inner surface of the terminal cover 19 is fitted into the positioning recess 11c-1 disposed inside the depression 11b-1 and provided in the outer side wall 11c of the casing body 11. Consequently, the terminal cover 19 containing the electrical wire pressing section 18a of the bolt-fastened terminal 18 on the electrical wire end is fitted in the depression 11b-1 provided in the outer side wall 11b of the casing body 11, thereby positioning the terminal cover 19 on the casing body 11.

The electrical contact section 18b of the bolt-fastened terminal 18 projecting from the terminal cover 19 is superimposed on the terminal portion 14a of the bus bar 14 by fitting the terminal cover 19 in the depression 11b-1. The terminal cover 19 serves as a watertight wall continued to the outer side wall 11b of the casing body 11. The electrical wire w is drawn horizontally along the outer side wall 11b of the casing body 11.

When the electrical contact section 18b is superimposed on the terminal portion 14a of the bus bar 14, the bolt hole 18b-1 in the electrical contact section 18b is communicated with the bolt hole 14a-1 in the bus bar terminal portion 14a. A bolt B is inserted into the mutually communicated bolt holes 18b-1 and 14a-1 and the bolt B is secured by a nut N at the lower end, as shown in FIG. 2B. Thus, the bolt-fastened terminal 18 is connected to the bus bar terminal portion 14a. This bolt fastening action can positively secure the terminal cover 19 to the casing body 11.

After completing the wiring or the like onto the casing body 11, the upper cover 12 is fitted on the upper surface of the casing body 11 while the lower cover 13 is fitted on the lower surface of the casing body 11. Thus, the assembling process of the electrical junction box 10 is finished.

As described above, since the terminal cover 19 encloses the electrical wire pressing section 18a of the bolt-fastened terminal 18, it is possible to protect and waterproof the electrical wire pressing section 18a, although a cover wall is not provided on the upper cover 12. Since the terminal cover 19 is fitted in the depression 11b-1 provided on the outer side wall 11b of the casing body 11, the terminal cover 19 can serve as a part of the outer side wall 11b of the casing body 11. Accordingly, it is possible to downsize the casing body 11 and to save space.

Furthermore, merely by superimposing the electrical contact section 18b of the bolt-fastened terminal 18 on the terminal portion 14a of the bus bar 14 and by fastening them by the bolt, it is possible to electrically interconnect the terminals (14a, 18b) and simultaneously to secure the terminal cover 19 to the casing body 11. Since a worker can draw the electrical wire w horizontally so that the electrical wire w can be disposed closely along the outer side wall 11b of the casing body 11, although the worker does not hold the drawing direction of the electrical wire w in the horizontal direction by hand, it is possible to enhance workability and to effectively prevent interference between the electrical wire w and peripheral parts. According to the above structure, it is also possible to shorten the electrical wire w, since the electrical wire w is not loosened.

As described above, the electrical contact section 18b provided with the bolt hole 18b-1 projects from the distal end of the electrical wire pressing section 18a of the bolt-fastened terminal 18 in a direction substantially perpendicular to the terminal axis so that the surface of the electrical wire pressing section 18a intersects the surface of the electrical contact section 18b substantially perpendicularly. Consequently, the drawing direction of the electrical wire w is set to be the horizontal direction along the outer side wall 11b of the casing body 11 and the electrical wire pressing section 18a is disposed along the outer side wall 11c of the casing body 11 on the upper surface of which the bus bar terminal portion 14a is disposed. The electrical contact section 18b is superimposed on the bus bar terminal portion 14a and they are secured by the bolt.

As described above, the terminal cover 19 comprises the first and second rectangular divided members 21 and 22, which can be opened and closed through hinge portions 20. The first divided member 21 contains the electrical wire pressing section 18a while the second divided member 22 can close the first divided member 21. In the closing position of the second divided member 22, the electrical contact section 18b of the terminal 18 projects from the first and second divided members 21 and 22. It is possible for a worker to contain the whole of the electrical wire pressing section 18a of the bolt-fastened terminal 18 in the terminal cover 19 and to close the terminal cover 19 by a very easy operation. Only the electrical contact section 18b can project from the clearance between the first and second divided members 21 and 22 that are closed and coupled to each other.

As described above, since the bulged portion 21c for fitting the electrical wire is provided on the first divided member 21 of the terminal cover 19, the bulged portion 21c can cover further outward the electrical wire w including the electrical wire pressing section 18a in accordance with a diameter size of the electrical wire. Consequently, the electrical wire w itself can be positively fixed and disposed closely along the casing body 11. Accordingly, since it is possible to more reliably hold the electrical wire w horizontally and to prevent the electrical wire w from being loosened, it is possible to effectively prevent interference between the electrical wire w and other parts and to shorten the electrical wire w.

As described above, since the guide grooves 11b-3 are provided in the opposite side portions 11b-2 interposing the depression 11b-1 of the casing body 11 and the guide projections 21f are provided on the projection wall 21e to oppose the guide grooves 11b-3 of the terminal cover 19, it is possible to easily fit the terminal cover 19 in the depression 11b-1 of the casing body 11 merely by sliding the guide projections 21f in the guide grooves 11b-3 to the lower end, thereby positioning the terminal cover 19 in the casing body 11. It is possible to reliably secure the terminal cover 19 in the casing body 11 by fastening the bolt on the bolt-fastened terminal 18 only by one time.

In the fitting position mentioned above, since the terminal cover 19 defines the watertight wall continued to the outer side wall 11b of the casing body 11, it is possible to effectively prevent water from entering the casing body 11.

As described above, the positioning rib 22d is provided on the outer surface of the second divided member 22 having no bulged portion 21c for fitting the electrical wire. The positioning recess 11c-1 is provided on the outer side wall 11c of the casing body 11 inside the depression 11b-1. The guide projections 21f are inserted into the guide grooves 11b-3. The positioning rib 22d is fitted in the positioning recess 11c-1. Thus, it is possible to more positively position the terminal cover 19 in the casing body 11.

The above-described embodiments are illustrative and not limiting. Various modifications, substitutes or the like are possible within the spirit and scope of the invention.

What is claimed is:

1. An electrical junction box comprising:
   a casing body;
   a bus bar that serves as an internal circuit, the bus bar including a bus bar terminal portion;
   an electrical wire;
   a terminal attached to the electrical wire, the terminal including an electrical wire pressing section, the terminal also including an electrical contact section extending from the electrical wire pressing section in a direction perpendicular to a terminal axis, the electrical contact section including a first fastener opening, the electrical contact section being superimposed on the bus bar terminal portion, and a fastener being inserted into the first fastener opening and into a second fastener opening provided in the bus bar terminal portion; and
   a terminal cover that encloses the electrical wire pressing section of the terminal,
   wherein the bus bar terminal portion is disposed on an outer edge of a first surface of said casing body to be connected to the terminal;
   wherein the electrical wire is arranged along an outer side wall of the casing body; and
   wherein the terminal cover is fitted in a depression provided in the outer side wall of the casing body.

2. The electrical junction box according to claim 1 wherein the fastener is a bolt.

3. An electrical junction box according to claim 1,
   wherein the depression extends from an upper end to a lower end of the outer side wall of the casing body;
   wherein the terminal cover includes first and second divided members coupled to each other through hinge portions;
   wherein the first and second divided members can be opened and closed with respect to each other;
   wherein the first divided member includes a bulged portion for fitting the electrical wire and the second divided member has a flat inner surface; and
   wherein the electrical contact section of the terminal projects from the terminal cover when the electrical wire pressing section of the terminal is contained in the first divided member and the second divided member closes the first divided member.

4. An electrical junction box according to claim 3, wherein the depression is rectangular.

5. An electrical junction box according to claim 1, further comprising:
   a guide groove provided on at least one of opposite side portions interposing the depression in the casing body; and
   a guide projection provided on the terminal cover,
   wherein the cover serves as a watertight wall continued to the outer side wall of the casing body when the guide projection is inserted into the guide groove to fit the terminal cover in the depression.

6. An electrical junction box according to claim 3, further comprising:
   a positioning rib provided on an outer surface of the second divided member; and
   a positioning recess provided in an outer surface of the casing body inside the depression,
   wherein the guide projection is inserted into the guide groove; and
   wherein the positioning rib is fitted in the positioning recess.

7. An electrical junction box according to claim 1, further comprising:
   an upper cover attached to the casing body; and
   a lower cover attached to the casing body,
   wherein the terminal cover is attached to the casing body between the upper cover and the lower cover.

8. An electrical junction box comprising:
   a casing body including a depression in an outer side wall and a bus bar terminal portion, the bus bar terminal portion including a bus bar opening;
   a terminal including an electrical wire pressing section and an electrical contact section, the electrical contact section extending substantially perpendicularly to the electrical wire pressing section and including a terminal opening; and
   a terminal cover that contains the wire pressing section, the terminal cover including first and second divided members, the electrical wire pressing section being clamped between the first and second divided members,
   wherein the terminal cover is fitted into the depression in the casing and a fastener is inserted into the terminal opening and the bus bar opening to secure the terminal to the casing body.

* * * * *